(12) United States Patent
Park et al.

(10) Patent No.: US 9,640,598 B2
(45) Date of Patent: May 2, 2017

(54) PAD ELECTRODE STRUCTURE AND ORGANIC LIGHT-EMITTING DISPLAY APPARATUS INCLUDING THE PAD ELECTRODE STRUCTURE

(71) Applicant: SAMSUNG DISPLAY CO., LTD., Yongin, Gyeonggi-Do (KR)

(72) Inventors: Kyung-Hoon Park, Yongin (KR); Sun Park, Yongin (KR); Yeong-Ho Song, Yongin (KR); Yul-Kyu Lee, Yongin (KR); Won-Ho Jang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 41 days.

(21) Appl. No.: 14/493,923

(22) Filed: Sep. 23, 2014

(65) Prior Publication Data
US 2015/0108452 A1  Apr. 23, 2015

(30) Foreign Application Priority Data
Oct. 18, 2013 (KR) ........................ 10-2013-0124923

(51) Int. Cl.
*H01L 29/08* (2006.01)
*H01L 35/24* (2006.01)
(Continued)

(52) U.S. Cl.
CPC ...... *H01L 27/3258* (2013.01); *H01L 27/3276* (2013.01); *H01L 51/5253* (2013.01)

(58) Field of Classification Search
CPC ............. H01L 27/3258; H01L 27/3276; H01L 51/5203
(Continued)

(56) References Cited

U.S. PATENT DOCUMENTS

| 7,315,047 B2* | 1/2008 | Kawakami .......... H01L 27/3244 257/59 |
| 2006/0131730 A1* | 6/2006 | Nakamura .............. H01L 23/13 257/700 |

(Continued)

FOREIGN PATENT DOCUMENTS

| KR | 10-2000-0010306 A | 2/2000 |
| KR | 10-2012-0031364 | 4/2012 |

(Continued)

*Primary Examiner* — Robert Huber
(74) *Attorney, Agent, or Firm* — Lee & Morse, P.C.

(57) ABSTRACT

An organic light-emitting display apparatus includes a pad electrode structure having excellent reliability due to the prevention of propagation of a crack to the pad electrode. The organic light-emitting display apparatus includes further an interlayer insulating layer on the pad electrode, a conductive barrier layer, and a planarization insulating layer. The interlayer insulating layer includes a plurality of openings that expose an upper surface of the pad electrode. The conductive barrier layer is on the plurality of openings and the interlayer insulating layer. The planarization insulating layer covers an edge of the conductive barrier layer. The planarization insulating layer is in the openings and covers an edge of the conductive barrier layer. An upper portion of the planarization insulating layer may be substantially planar with an upper portion of the conductive barrier layer on convex portions of the interlayer insulating layer.

20 Claims, 14 Drawing Sheets

(51) Int. Cl.
    *H01L 51/00*    (2006.01)
    *H01L 23/48*    (2006.01)
    *H01L 23/52*    (2006.01)
    *H01L 29/40*    (2006.01)
    *H01L 27/32*    (2006.01)
    *H01L 51/52*    (2006.01)
(58) Field of Classification Search
    USPC .................... 257/40, E51.019, E51.022, 781
    See application file for complete search history.

(56) References Cited

U.S. PATENT DOCUMENTS

| | | | |
|---|---|---|---|
| 2012/0074388 A1* | 3/2012 | Park .................... | H01L 27/3258 257/40 |
| 2012/0074408 A1 | 3/2012 | Moon et al. | |
| 2012/0139000 A1* | 6/2012 | Lee .................... | H01L 27/3276 257/99 |
| 2013/0001563 A1 | 1/2013 | Park et al. | |
| 2013/0001564 A1 | 1/2013 | Choi et al. | |
| 2014/0353620 A1 | 12/2014 | Park et al. | |

FOREIGN PATENT DOCUMENTS

| | | |
|---|---|---|
| KR | 10-2013-0007050 | 1/2013 |
| KR | 10-2013-0007053 | 1/2013 |
| KR | 10-2014-0140987 | 12/2014 |

* cited by examiner

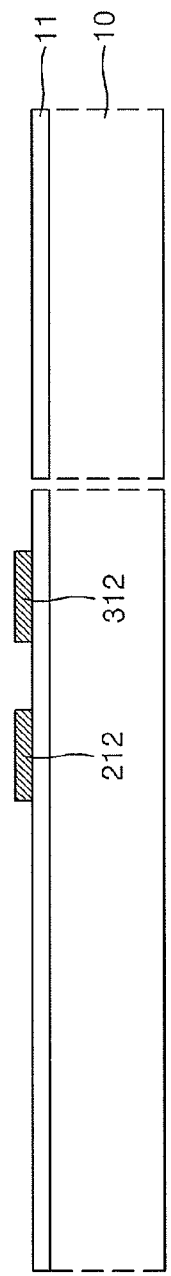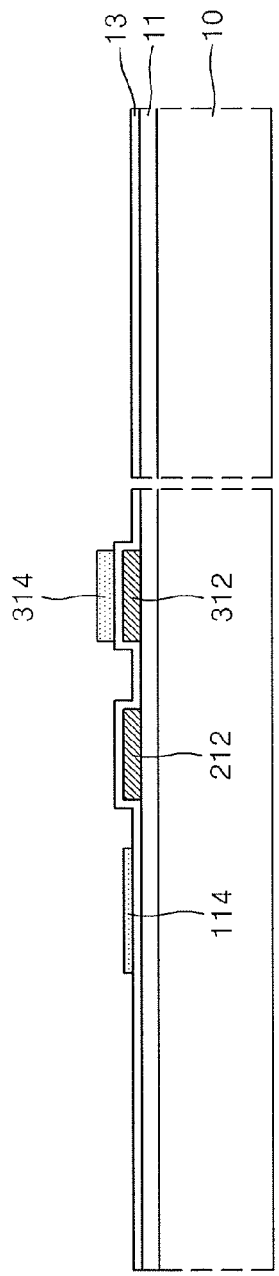

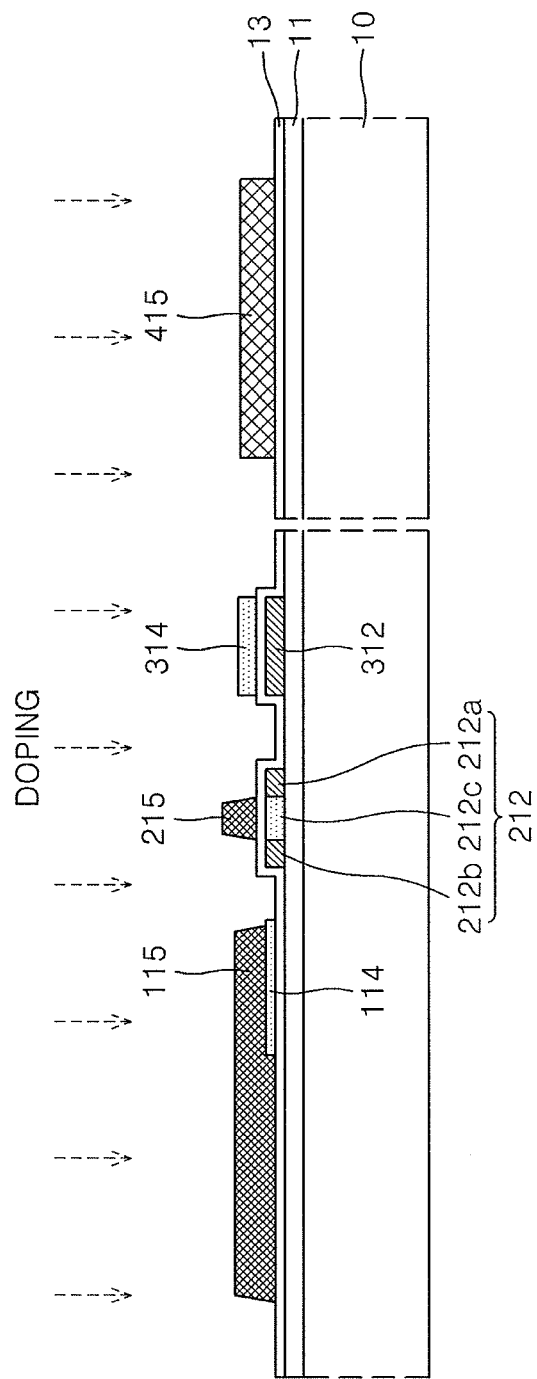

PAD ELECTRODE STRUCTURE AND ORGANIC LIGHT-EMITTING DISPLAY APPARATUS INCLUDING THE PAD ELECTRODE STRUCTURE

CROSS-REFERENCE TO RELATED APPLICATION

Korean Patent Application No. 10-2013-0124923, filed on Oct. 18, 2013, in the Korean Intellectual Property Office, and entitled: "Pad Electrode Structure And Organic Light-Emitting Display Apparatus Including The Pad Electrode Structure," is incorporated by reference herein in its entirety.

BACKGROUND

1. Field

Embodiments relate to a pad electrode structure and an organic light-emitting display apparatus including the pad electrode structure.

2. Description of the Related Art

An organic light-emitting display (OLED) apparatus is a self-luminous display apparatus that may include a plurality of organic light-emitting devices each including a hole injection electrode, an electron injection electrode, and an organic emission layer provided therebetween. Light is emitted when holes injected from the hole injection electrode are combined with electrons injected from the electron injection electrode in the organic emission layer. OLED apparatuses have been on the spotlight as the next generation display apparatuses due to their high quality characteristics such as low power consumption, high brightness, and fast response speeds.

SUMMARY

Embodiments are directed to an organic light-emitting display apparatus that includes a pad electrode, an interlayer insulating layer on the pad electrode, a conductive barrier layer, and a planarization insulating layer. The interlayer insulating layer includes a plurality of openings that expose an upper surface of the pad electrode. The conductive barrier layer is on the plurality of openings and the interlayer insulating layer. The planarization insulating layer covers an edge of the conductive barrier layer. The planarization insulating layer is in the openings.

The interlayer insulating layer may include convex portions between the plurality of openings of the conductive barrier layer. An upper portion of the planarization insulating layer may be substantially planar with an upper portion of the conductive barrier layer on the convex portions. The planarization insulating layer may include an organic insulating material. The interlayer insulating layer may include an inorganic insulating material. The conductive barrier layer may include indium tin oxide, indium zinc oxide, zinc oxide, indium oxide, indium gallium oxide, or aluminum zinc oxide An organic light-emitting display apparatus is provided that includes a plurality of pixels and a pad electrode structure that is electrically connected to the plurality of pixels. The plurality of pixels include at least one thin film transistor, a conductive contact layer, a pixel electrode, an opposite electrode, and an intermediate layer. The at least one thin film transistor includes an active layer, a gate electrode, a source electrode, and a drain electrode. The conductive contact layer is on the source electrode or the drain electrode. The pixel electrode is connected to the source electrode or the drain electrode via the conductive contact layer. The opposite electrode is opposite to the pixel electrode. An intermediate layer includes an organic emission layer between the pixel electrode and the opposite electrode. The pad electrode structure includes a pad electrode, an interlayer insulating layer, a conductive barrier layer, and a planarization insulating layer. The pad electrode is electrically connected to the pixels. The interlayer insulating layer is on the pad electrode and includes a plurality of openings that expose an upper surface of the pad electrode. The conductive barrier layer includes a same material as the conductive contact layer. The conductive barrier layer is on the plurality of openings and the interlayer insulating layer. The planarization insulating layer covers an edge of the conductive barrier layer. The planarization insulation layer is in the openings.

The pad electrode may include a same material as the gate electrode and may be in a same layer of the gate electrode. The interlayer insulating layer may include a same material as an insulating layer between the gate electrode and the source and drain electrodes. The planarization insulating layer may include a same material as an insulating layer covering the source electrode and the drain electrode. The interlayer insulating layer may include convex portions between the plurality of openings. An upper portion of the planarization insulating layer may be substantially planar with an upper portion of the conductive barrier layer on the convex portions.

The planarization insulating layer may include an organic insulating material. The interlayer insulating layer may include an inorganic insulating material. The conductive contact layer and the conductive barrier layer may include indium tin oxide, indium zinc oxide, zinc oxide, indium oxide, indium gallium oxide, or aluminum zinc oxide.

The pixel electrode may include a semi-transparent metal layer. The semi-transparent metal layer may include silver (Ag) or silver alloy. The pixel electrode further may include a first transparent conductive oxide layer under the semi-transparent metal layer and a second transparent conductive oxide layer over the semi-transparent metal layer.

The organic light-emitting display apparatus may further include a first insulating layer between the active layer and the gate electrode, a second insulating layer between the gate electrode and the source and drain electrodes, and a third insulating layer covering an edge of the pixel electrode. The second insulating layer, the third insulating layer, and the fourth insulating layer may include openings that overlap each other. The opening in the third insulating layer may be larger than the opening in the fourth insulating layer and smaller than the opening in the second insulating layer. The pixel electrode may be in the opening in the third insulating layer.

The organic light-emitting display apparatus may further include a capacitor. The capacitor may include a first electrode and a second electrode. The first electrode may be in a same layer as the active layer and may include a semiconductor material doped with ion impurities. The second electrode may be in a same layer as the gate electrode and may include a transparent conductive oxide material.

BRIEF DESCRIPTION OF THE DRAWINGS

Features will become apparent to those of skill in the art by describing in detail exemplary embodiments with reference to the attached drawings in which:

These and/or other aspects will become apparent and more readily appreciated from the following description of the embodiments, taken in conjunction with the accompanying drawings in which:

FIGS. 7A to 7I schematically illustrate diagrams of stages of a method of manufacturing an OLED apparatus.

DETAILED DESCRIPTION

Figure 1:
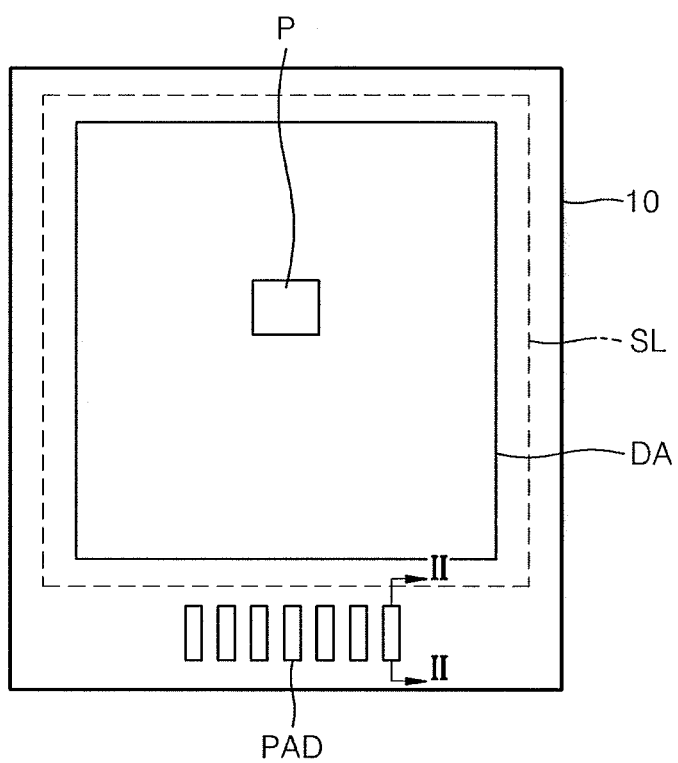
FIG. 1 schematically illustrates a plan view of an OLED apparatus.

Reference will now be made in detail to embodiments, examples of which are illustrated in the accompanying drawings, wherein like reference numerals refer to like elements throughout. The present embodiments may have different forms and should not be construed as being limited to the descriptions set forth herein. Sizes of elements in the drawings may be exaggerated for convenience of explanation. As sizes and thicknesses of components in the drawings are arbitrarily illustrated for convenience of explanation, the following embodiments are not limited thereto.

The present disclosure may include various embodiments and modifications, and exemplary embodiments are illustrated in the drawings and are described in detail. The effects and features of the present disclosure and the accomplishing method thereof are apparent from the following description of the embodiments, taken in conjunction with the accompanying drawings. However, the prevent disclosure is not limited the embodiments described herein, and may be embodied in various modes.

The term "and/or" may include any and all combinations of one or more of the associated listed items. Expressions such as "at least one of," when preceding a list of elements, modify the entire list of elements and do not modify the individual elements of the list. Although the terms "first," "second," and the like may be used herein to describe various components, these components are not limited by these terms. These terms are only used to distinguish one component from another. The singular forms "a," "an," and "the" include the plural forms as well, unless the context clearly indicates otherwise. The terms "comprises" and/or "comprising" specify the presence of stated features or components, but do not preclude the presence or addition of one or more other features or components. When a layer, region, or component is referred to as being "formed on" another layer, region, or component, it can be directly or indirectly formed on the other layer, region, or component. That is, for example, intervening layers, regions, or components may be present.

FIG. 1 schematically illustrates a plan view of an OLED apparatus. Referring to FIG. 1, a display area DA, including a plurality of pixels P and configured to display images, and a pad portion PAD, may be on a substrate 10 of the OLED apparatus. The display area DA may be within a sealing line SL, and an encapsulating member encapsulating the display area DA may be along the sealing line SL. The pad portion PAD, which may be electrically connected to the pixels P and may be a connection terminal of an external driver IC, may be provided outside the display area DA.

Figure 2:
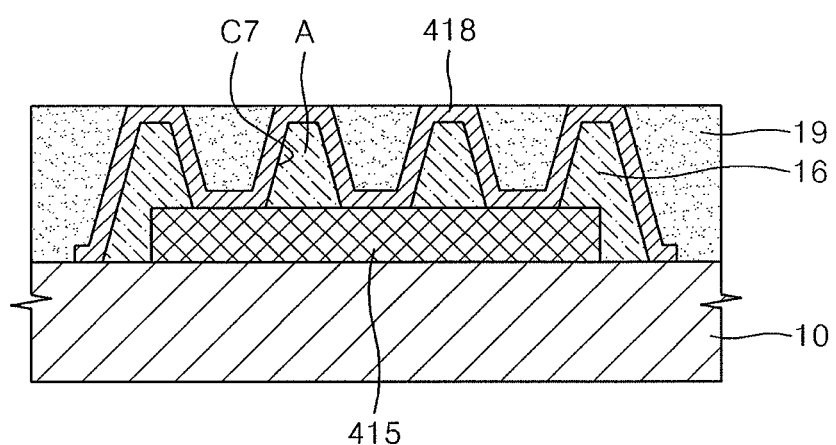
FIG. 2 schematically illustrates a plan view of a pad electrode structure.

FIG. 2 illustrates a plan view of a pad electrode structure. Referring to FIG. 2, a pad electrode 415 may be provided on the substrate 10. The substrate 10 may include a glass substrate, a plastic substrate formed of polyethylene terephthalate (PET), polyethylene naphthalate (PEN), or polyimide. A buffer layer may be further provided on the substrate 10 in order to perform surface planarization and prevent penetration of impurities. The buffer layer may include a single layer or layers including silicon nitride and/or silicon oxide.

The pad electrode 415 may include a single layer or layers formed of conductive metal having a low resistance. The pad electrode 415 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer insulating layer 16 may be on the pad electrode 415. A plurality of openings C7 exposing an upper surface of the pad electrode 415 may be in the interlayer insulating layer 16. Convex portions A may be formed between the plurality of openings C7 by patterning the interlayer insulating layer 16 to have a concave-convex shape. The interlayer insulating layer 16 may include an inorganic insulating material.

A conductive barrier layer 418 may be on the plurality of openings C7 and the convex portions A of the interlayer insulating layer 16. The conductive barrier layer 418 may include one or more of indium tin oxide, indium zinc oxide, zinc oxide, indium oxide, indium gallium oxide, and aluminum zinc oxide. The conductive barrier layer 418 may prevent the pad electrode 415 from being exposed to moisture and oxygen, thereby preventing a decrease in reliability of the pad.

A planarization insulating layer 19 may be on the conductive barrier layer 418. The planarization insulating layer 19 may cover an edge of the conductive barrier layer 418 and to fill the openings C7 in the interlayer insulating layer 16. An upper portion of the planarization insulating layer 19 may be substantially planar with an upper portion of the conductive barrier layer 418 on the convex portions A of the interlayer insulating layer 16. The planarization insulating layer 19 may include an organic insulating material.

Figure 3A:
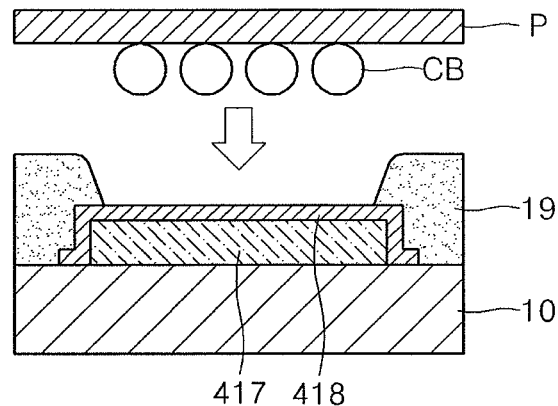
FIGS. 3A-3C illustrate cross-sectional views of a process of attaching and removing a printed circuit board P to and from a pad electrode structure according to a comparative example.
Figure 3B:
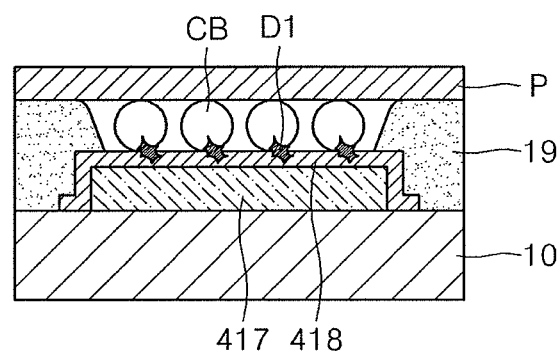
Figure 3C:
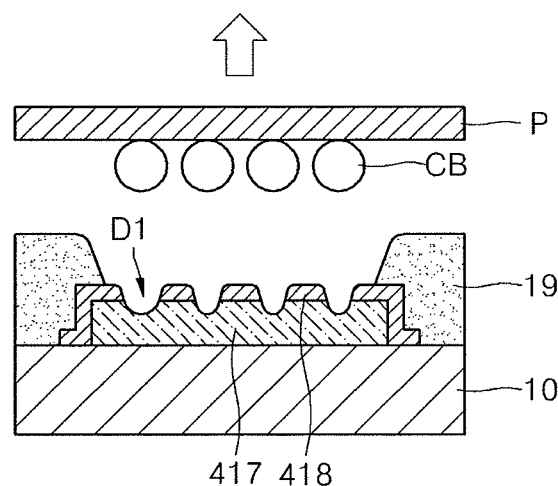

FIGS. 3A-3C illustrate cross-sectional views of a process of attaching and removing a printed circuit board P to and from a pad electrode structure according to a comparative example. Referring to FIGS. 3A-3C, in the pad electrode structure according to the comparative example, a pad electrode 417 may be provided on a substrate 10. A conductive barrier layer 418 may be formed on the pad electrode 417. A planarization insulating layer 19 may expose an upper portion of the conductive barrier layer 418 and may cover an edge of the conductive barrier layer 418.

A process of attaching a printed circuit board P, such as an anisotropic conductive film (ACF) on which an external driver IC is mounted, to the pad electrode structure may be performed one or more times. When the printed circuit board P is attached to the pad electrode structure, for example, a defective portion D1, such as a crack, may be caused in the conductive barrier layer 418 covering the upper portion of the pad electrode 417, for example, when conductive balls CB formed on the printed circuit board P are pressed against the pad electrode structure. The crack formed in the conductive barrier layer 148 may propagate to the pad electrode 417, causing damage in the pad electrode 417 and corrosion of the pad electrode 417. The corrosion of the pad electrode 417 may continue even after the printed circuit board P is removed, which may cause corrosion of other wirings electrically connectable to the pad electrode 417.

Figure 4A:
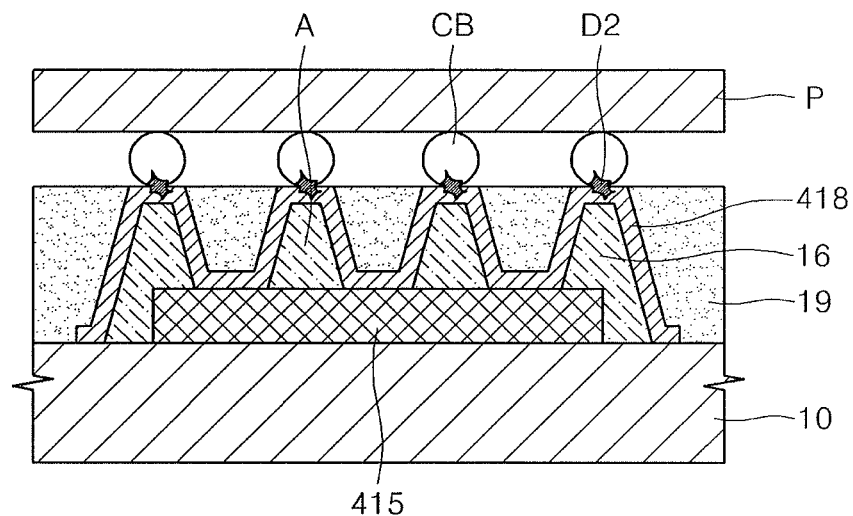
FIGS. 4A and 4B illustrate cross-sectional views of a process of attaching and removing a printed circuit board to and from the pad electrode structure of FIG. 2.
Figure 4B:
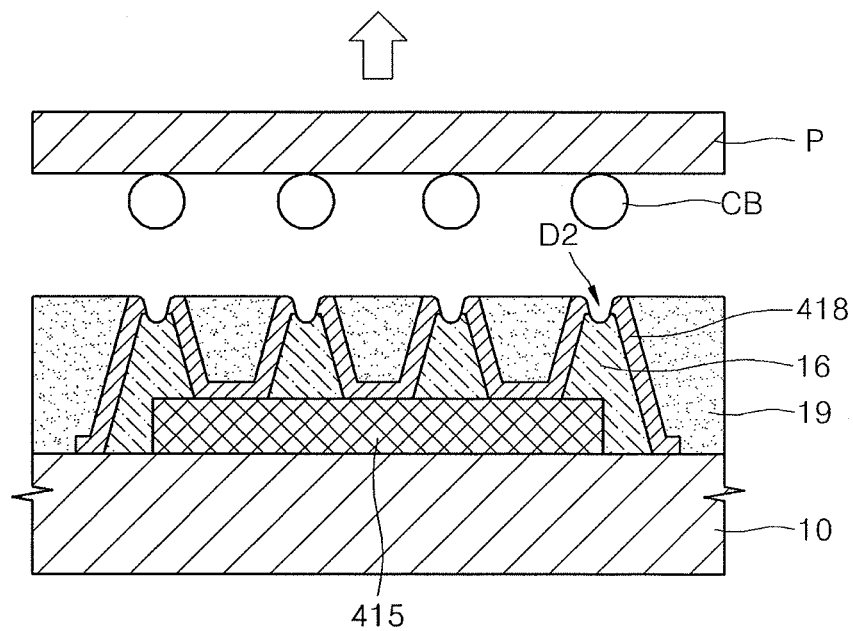

FIGS. 4A and 4B illustrate cross-sectional views of a process of attaching and removing a printed circuit board to and from the pad electrode structure of FIG. 2. Referring to FIGS. 4A and 4B, when the printed circuit board P is attached to the pad electrode structure according to the present embodiment, for example, a defective portion D2, such as a crack, may be caused in the conductive barrier layer 418 covering the upper portion of the pad electrode 415, for example, when conductive balls CB formed on the printed circuit board P are pressed against the pad electrode structure. The crack formed in the conductive barrier layer 418 does not propagate to the pad electrode 415, compared to the comparative example. The pad electrode 415 need not be directly exposed to the defective portion D2 in the conductive barrier layer 418 as the interlayer insulating layer 16 may be patterned to have the concave-convex shape under the defective portion D2. The convex portions A of the interlayer insulating layer 16 may be under the defective portion D2, thereby preventing the propagation of the crack to the pad electrode 415.

Although the conductive balls CB may be illustrated as being pressed at locations corresponding to the convex portions A in FIG. 4A, in other implementations, for example, the conductive balls CB may be located in regions between the convex portions A. The conductive balls CB that are pressed against the regions between the convex portions A may be directly attached to the planarization insulating layer 19 filling the spaces between the convex portions A. The conductive barrier layer 418 that is on the side of or under the planarization insulating layer 19 may be not damaged. Accordingly, the crack in the conductive barrier layer 418 may be prevented from propagating to the pad electrode 415. The corrosion of the pad electrode 415 may be prevented, thereby preventing the corrosion of other wirings electrically connectable to the pad electrode 415 and providing a pad electrode structure having excellent reliability.

Figure 5A:
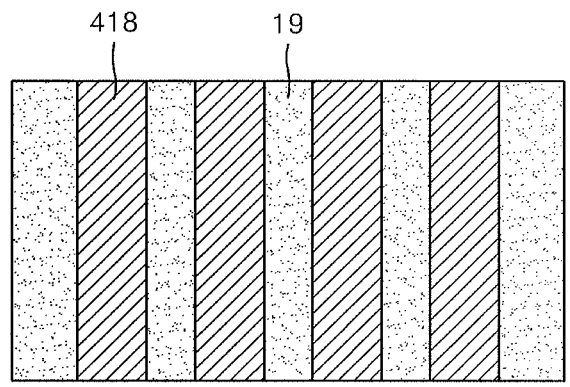
FIGS. 5A and 5B illustrate plan views of pad electrode structures.
Figure 5B:
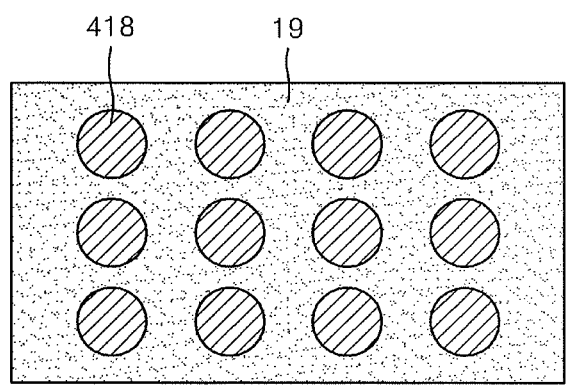

FIGS. 5A and 5B illustrate plan views of pad electrode structures. FIG. 5A illustrates a plan view in which convex portions A (see FIG. 2) are formed by patterning an interlayer insulating layer 16 (see FIG. 2) into a stripe shape. A conductive barrier layer 418 may be on the convex portions A resulting from patterning to form a stripe shape, and a planarization insulating layer 19 may be formed between the convex portions A.

FIG. 5B illustrates a plan view in which convex portions A (see FIG. 2) are formed by patterning an interlayer insulating layer 16 (see FIG. 2) into a circular shape. A conductive barrier layer 418 may be on the convex portions A resulting from patterning to form a circular shape, and a planarization insulating layer 19 may be between the convex portions A. FIGS. 5A and 5B merely illustrate examples of pad electrode structures. In other implementations, various types of other structures may also be made and used.

Figure 6:
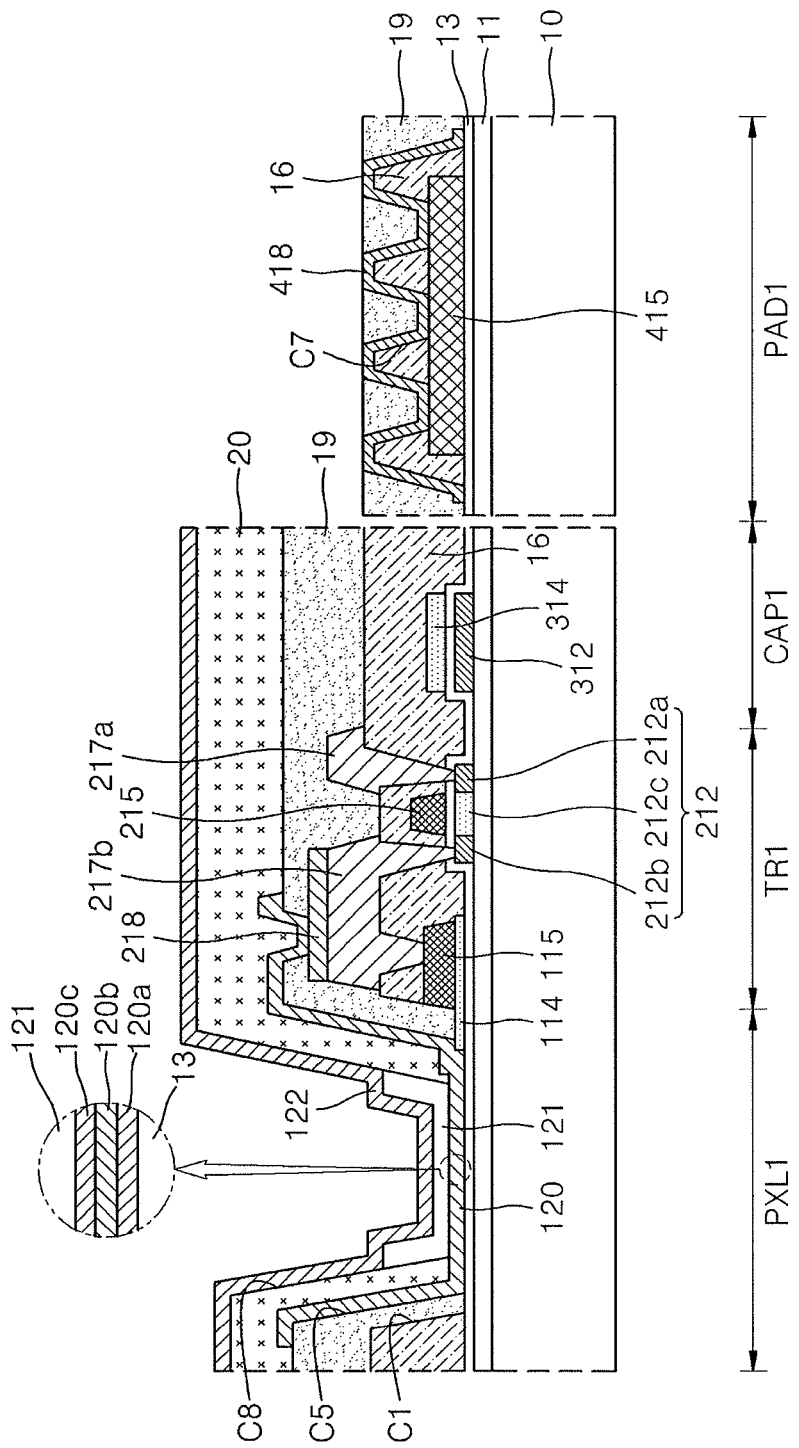
FIG. 6 schematically illustrates a cross-sectional view of parts of a pixel and a pad portion of an OLED apparatus.

FIG. 6 schematically illustrates a cross-sectional view of parts of a pixel P and a pad portion PAD of an OLED apparatus. Referring to FIG. 6, a pixel area PXL1 including at least one organic emission layer 121, a transistor area TR1 including at least one thin film transistor, a capacitor area CAP1 including at least one capacitor, and a pad area PAD1 may be on a substrate 10 of the OLED apparatus. The substrate 10 may include one or more of a glass substrate, or a plastic substrate formed of PET, PEN, or polyimide.

A buffer layer 11 may also be on the substrate 10 in order to perform surface planarization and prevent penetration of impurities. The buffer layer 11 may include a single layer or layers including silicon nitride and/or silicon oxide. The thin film transistor may include an active layer 212, a gate electrode 215, source electrode 217a, and a drain electrode 217b. The active layer 212 may include a channel region 212c, a source region 212a, and a drain region 212b. The source region 212a and the drain region 212b may be formed by being doped with ion impurities at the outer sides of the channel region 212a. The active layer 212 may include various materials. For example, the active layer 212 may include an inorganic semiconductor material, such as amorphous silicon or polysilicon. The active layer 212 may include an oxide semiconductor. The active layer 212 may include an organic semiconductor material.

A first insulating layer 13 that is a gate insulating film may be on the active layer 212. The gate electrode 215 may be on the first insulating layer 13 at a location corresponding to the channel region 212c. The gate electrode 215 may include a single layer or layers formed of at least one metal selected from Al, Pt, Pd, Ag, Mg, Au, Ni, Nd, Ir, Cr, Li, Ca, Mo, Ti, W, and Cu. A second insulating layer 16 that is an interlayer insulating layer may be on the gate electrode 215, and the source and drain electrodes 217a and 217b may be on the second insulating layer 16.

The source electrode 217a and the drain electrode 217b may be connected respectively to the source region 212a and the drain region 212b of the active layer 212 through openings in the second insulating layer 16. The source electrode 217a and the drain electrode 217b may be formed by stacking at least two layers including different types of metals having different electron mobilities. For example, the source electrode 217a and the drain electrode 217b may be formed by stacking at least two layers including at least one metal selected from Al, Pt, Pd, Ag, Mg, Au, Ni, Nd, Ir, Cr, Li, Ca, Mo, Ti, W, and Cu. Wirings, such as data wirings and electrode power supply wirings, including the same material as the source electrode 217a and the drain electrode 217b may be in the same layer as the source and drain electrodes 217a and 217b.

The first insulating layer 13 and the second insulating layer 16 may include an inorganic insulating film. The first insulating layer 13 and the second insulating layer 16 may include a single layer or layers including at least one of $SiO_2$, $SiN_x$, SiON, $Al_2O_3$, $TiO_2$, $Ta_2O_5$, $HfO_2$, $ZrO_2$, BST, and PZT.

A conductive contact layer 218 may be on the drain electrode 217b. The conductive contact layer 218 may protect the drain electrode 217b such that the drain electrode 217b is not exposed to an etchant during etching of a pixel electrode 120, Accordingly, metal included in the pixel electrode 120 may be prevented from being re-precipitated due to reaction between the metal included in the pixel electrode 120 and the drain electrode 217b, thereby preventing a particle-type defect. The conductive contact layer 218 may include one or more of indium tin oxide, indium zinc oxide, zinc oxide, indium oxide, indium gallium oxide, and aluminum zinc oxide. Although the conductive contact layer 218 is shown as being only on the drain electrode 217b in FIG. 6, in other implementations, for example, the conductive contact layer 218 may be on the source electrode 217a, and also on wirings, such as data wirings and electrode power supply wirings, on the same layer as the source and drain electrodes 217a and 217b.

A third insulating layer 19 serving as a planarization insulating layer that covers the source electrode 217a and the drain electrode 217b may be on the second insulating layer 16. The third insulating layer 19 may include a single layer or layers formed of an organic insulating film. The third insulating layer 19 may include one or more of a general-purpose polymer (PMMA, PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A fourth insulating layer 20 may be on the third insulating layer 19. The fourth insulating layer 20 may include an organic insulating film. The fourth insulating layer 20 may include one or more of a general-purpose polymer (PMMA, PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. An intermediate layer, including the pixel electrode 120, an opposite electrode 122 corresponding to the pixel electrode 120, and the organic emission layer 121 between the pixel electrode 120 and the opposite electrode 122, may be in the pixel area PXL1.

The thin film transistor illustrated in FIG. 6 may be a driving transistor that drives an organic light-emitting device. Although a driving transistor is illustrated in FIG. 6, for example, the OLED apparatus may further include a switching transistor and or a compensation transistor. The structure of the thin film transistor illustrated in FIG. 6 is merely one example that may be applied to an OLED apparatus. Any suitable structure of a thin film transistor may be used.

The pixel electrode 120 may include a semi-transparent material. The pixel electrode 120 may include a semi-transparent metal layer 120b. A first transparent conductive oxide layer 120a and a second transparent conductive oxide layer 120c both including transparent conductive oxide may further be under and over the semi-transparent metal layer 120b, respectively. The semi-transparent metal layer 120b may include silver (Ag) and/or silver (Ag) alloy. The semi-transparent metal layer 120b and the opposite electrode 122, which may be a reflective electrode may form a micro-cavity structure together, thereby improving an optical efficiency of the OLED apparatus.

The first and second transparent conductive oxide layers 120a and 120c may each include at least one selected from the group including indium tin oxide, indium zinc oxide, zinc oxide, indium oxide, indium gallium oxide, and aluminum zinc oxide.

The first transparent conductive oxide layer 120a under the semi-transparent metal layer 120b may improve adhesion between the pixel electrode 120 and the first insulating layer 13. The second transparent conductive oxide layer 120c over the semi-transparent metal layer 120b may serve as a barrier layer protecting the semi-transparent metal layer 120b.

When metal having a high reducibility, such as silver (Ag), is used to form the semi-transparent metal layer 120b, when electrons are provided, Ag ions present in a ionic state in the etchant may be re-precipitated as Ag particles during an etching process for patterning the pixel electrode 120. The precipitated silver (Ag) may be a cause of a particle defect causing a dark spot in subsequent processes of forming the pixel electrode 120.

In the process of etching the pixel electrode 120 including silver (Ag), wirings, such as data wirings and electrode power supply wirings, formed of the same material as the source electrode 217a and the drain electrode 217b, or the source electrode 217a or drain electrode 217b may be exposed to the etchant. Thus, silver (Ag) ions having a high reducibility may be provided with electrons from its metal material and be re-precipitated as silver. For example, when a metal includes molybdenum or aluminum, the molybdenum may again provide electrons transferred from the aluminum to silver (Ag) ions, and thus silver (Ag) may be re-precipitated. The re-precipitated silver (Ag) particles may be again attached to the pixel electrode 120, thereby becoming a particle-type pollution source. Therefore, a defect cause, such as a dark spot defect, may be generated.

In the organic light emitting display apparatus according to embodiments, on the other hand, during the patterning of the pixel electrode 120, the source electrode 217a, the drain electrode 217b, and data wirings and electrode power supply wirings, which may include the same material and in the same layer as the source electrode 217a and the drain electrode 217b, may be protected by being covered by the third insulating layer 19 that may be an organic planarization insulating layer. An Ag particle re-precipitated during the etching of the pixel electrode 120 may be prevented from reattaching to the pixel electrode 120, thereby preventing a defective dark spot.

The drain electrode 217b may be in an area that may be exposed to etchant through a contact hole C6 (see FIG. 7G) in the third insulating layer 19 during the patterning of the pixel electrode 120. The drain electrode 217b may be protected by the conductive contact layer 218 on an upper portion of the drain electrode 217b, thereby preventing direct exposure to the etchant. A particle-type defect due to re-precipitation of Ag may be prevented.

The pixel electrode 120 may be in an opening C5 in the third insulating layer 19. The organic emission layer 121 may include one or more of a low-molecular-weight material, a high-molecular-weight organic material, and a hybrid organic material in which the low-molecular-weight material is mixed with the high-molecular-weight organic material. The opening C5 formed in the third insulating layer 19 may be larger than an opening C8 in the fourth insulating layer 20 and may be smaller than an opening C1 in the second insulating layer 16. The opening C1 in the second insulating layer 16, the opening C5 in the third insulating layer 19, and the opening C8 in the fourth insulating layer 20 may overlap one another. An edge of the pixel electrode 120 may be covered by the fourth insulating layer 20, and an upper surface of the pixel electrode 120 may be exposed by the opening C8 formed in the fourth insulating layer 20. The fourth insulating layer 20 may serve as a pixel-defining layer.

An intermediate layer, including the organic emission layer 121, may be between the pixel electrode 120 and the opposite electrode 122. The intermediate layer may include, for example, at least one of a hole injection layer, a hole transport layer, an electron transport layer and an electron injection layer. Any suitable number and/or type of layers may be used. For example, the intermediate layer may further include other various functional layers.

An organic light-emitting device OLED illustrated in FIG. 6 is one example of one sub-pixel constituting a unit pixel. The sub-pixel may emit light of various colors. For example, the sub-pixel may emit red light, green light, or blue light. As another example, the sub-pixel may emit white light. When the sub-pixel emits white light, for example, the OLED apparatus may further include a color conversion layer or a color filter that converts white light into color light. The sub-pixel that emits white light may have various types of structures. For example, the sub-pixel may have a structure in which a light-emitting material that emits red light, a light-emitting material that emits green light, and a light-emitting material that emits blue light are stacked.

As still another example of a sub-pixel that emits white light, the sub-pixel may have a structure in which a light-emitting material that emits red light, a light-emitting material that emits green light, and a light-emitting material that emits blue light are mixed with each other. The red, green, and blue are merely examples. Any suitable color or combination of colors may be used. A combination of other colors may also be applied such that emission of white light is possible as well as the combination of red, green, and blue.

The opposite electrode 122 may be located as a common electrode in common with all or some pixels on the organic emission layer 121. The pixel electrode 120 may be used as an anode, and the opposite electrode 122 may be used as a cathode. However, in other implementations, the polarities of electrodes may be reversed. The opposite electrode 122 may be a reflective electrode including a reflective material. The opposite electrode 122 may include at least one metal layer selected from aluminum (Al), magnesium (Mg), nickel (Ni), calcium (Ca), and lithium nickel (LiF).

The pixel electrode 120 may be connected to the conductive contact layer 218 via the contact hole C6 (see FIG. 7G) in the third insulating layer 19, and the conductive contact layer 218 may be connected to the drain electrode 217b of the thin film transistor for driving. The pixel electrode 120 may be connected to the thin film transistor through a first contact layer 114 and a second contact layer 115.

The first contact layer 114 may be formed to protrude from the etched surfaces of the opening C1 in which the second insulating layer 16 is located and the opening C5 in which the third insulating layer 19 is located. The pixel electrode 120 may directly contact the protruded first contact layer 114, and the first contact layer 114 may contact the second contact layer 115. The second contact layer 115 may contact the thin film transistor via a contact hole C2 (see FIG. 7D) in the second insulating layer 16.

If a method of performing connection via the contact hole C6 in the third insulating layer 19 were to be the only method for electrically connecting the pixel electrode 120 to a driving device, the thickness of the pixel electrode 120 used as the semi-transparent metal layer may be thin and thus, a step coverage may be defective. Stable connection to the etched surface of the third insulating layer 19 or the contact hole C6 may not be well obtained. According to embodiments, on the other hand, the pixel electrode 120 may directly contact the first contact layer 114 in a bottom portion of the opening C5 even when, for example, a connection via the contact hole C6 in the third insulating layer 19 fails. Accordingly, a signal from the driving device may be normally received.

In the capacitor area CAP1, a capacitor may be on the substrate 10 and the buffer layer 11. The capacitor may include a first electrode 312 in the same layer as the active layer 212, a second electrode 314 in the same layer as the gate electrode 215, and a third electrode 317 in the same layer as the source and drain electrodes 217a and 217b. The first electrode 312 of the capacitor may include a semiconductor doped with ion impurities as in the source region 212a and the drain region 212b of the active layer 212.

The second electrode 314 of the capacitor may be on the first insulating layer 13, like the gate electrode 215. However, the material of the second electrode 314 may be different from that of the gate electrode 215. The material of the second electrode 314 may include a transparent conductive oxide. The capacitor may be formed to have a metal-insulator-metal (MIM) structure by forming the first electrode 312 with a semiconductor doped with ion impurities via the second electrode 314.

The third electrode 317 of the capacitor may include the same material as the source and drain electrodes 217a and 217b. The third electrode 317 may be covered by the third insulating layer 19 that is an organic planarization film. Accordingly, the third electrode 317 might not be exposed to etchant including Ag ions during etching of the pixel electrode 120 including Ag. A particle-type defect due to re-precipitation of Ag may be prevented. A capacitance of the OLED apparatus may increase without increasing the area of the capacitor by connecting the first electrode 312 and the second electrode 314 in parallel in the capacitor. The area of the capacitor is reduced by the increased capacitance. Accordingly, the aperture ratio thereof may increase.

The pad area PAD1, in which a pad electrode 415 that is a connection terminal of an external driver IC, may be outside the display area DA. The pad electrode 415 may include the same material as, and may be in the same layer, as the gate electrode 215. The pad electrode 415 may include a single layer or layers including conductive metal having a low resistance. The pad electrode 415 may include one or more of Al, Pt, Pd, Ag, Mg, Au, Ni, Nd, Ir, Cr, Li, Ca, Mo, Ti, W, and Cu. The pad electrode 415 may be connected to wirings electrically connected to pixels P of the display area DA to transfer a signal input from the external driver IC to the pixels P.

The second insulating layer 16 may be on the pad electrode 415. The second insulating layer 16 may include the same material as an inorganic insulating material serving as the interlayer insulating layer 16 between the gate electrode 215 and the source and drain electrodes 217a and 217b. A plurality of openings C7 exposing an upper surface of the pad electrode 415 may be in the second insulating layer 16. Convex portions A may be formed between the plurality of openings C7 by patterning the second insulating layer 16 to have a concave-convex pattern.

A conductive barrier layer 418 may be on the plurality of openings C7. The convex portions A may include the second insulating layer 16. The conductive barrier layer 418 may include the same material as the conductive contact layer 218. The conductive barrier layer 418 may include one or more of indium tin oxide, indium zinc oxide, zinc oxide, indium oxide, indium gallium oxide, and aluminum zinc oxide. The conductive barrier layer 418 may prevent the pad electrode 415 from being exposed to moisture and oxygen, thereby preventing a decrease in reliability of the pad.

The third insulating layer 19 may be on the conductive barrier layer 418. The third insulating layer 19 may include the same material as an organic insulating material serving as a planarization insulating layer 19 covering the source electrode 217a and the drain electrode 217b. The third insulating layer 19 may cover an edge of the conductive barrier layer 418 and may fill the openings C7 in the second insulating layer 16. An upper portion of the third insulating layer 19 that may be substantially planar with an upper portion of the conductive barrier layer 418 on the convex portions A may include the second insulating layer 16.

Accordingly, the pad electrode structure of FIG. 2 may be included. Therefore, even though a crack occurs in the conductive barrier layer 418 in a process of attaching a printed circuit board P (see FIGS. 4A and 4B) to the pad electrode structure, the crack of the conductive barrier layer 418 may be prevented from propagating to the pad electrode 415. In the pad electrode structure of the OLED apparatus, the pad electrode 415 may be protected by patterning the second insulating layer 16 in a concave-convex shape and filling between the convex portions A with the third insulating layer 19. A crack occurring in the conductive barrier layer 418 may be prevented from propagating to the pad electrode 415, thereby preventing corrosion of the pad electrode 415 and other wirings electrically connectable to the pad electrode 415. The conductive barrier layer 418 may include the same material and in the same process as the conductive contact layer 218, thereby simplifying a manufacturing process.

The OLED apparatus may further include an encapsulating member encapsulating the display area including the pixel area PXL1, the capacitor area CAP1, and the thin film transistor area TR1. The encapsulating member may include a substrate including one or more of a glass material, a metal film, and an encapsulating thin film that may be formed by alternately disposing an organic insulating film and an inorganic insulating film.

A method of manufacturing the OLED apparatus is described with reference to FIGS. 7A to 7I. FIGS. 7A to 7I schematically illustrate diagrams of a method of manufacturing an OLED apparatus.

FIG. 7A schematically illustrates a cross-sectional view of a first mask process of the method of manufacturing the OLED apparatus. Referring to FIG. 7A, a buffer layer 11 may be formed on a substrate 10, and a semiconductor layer may be formed on the buffer layer 11. Thereafter, an active layer 212 of a thin film transistor and a first electrode 312 may be formed by patterning the semiconductor layer. A photoresist may be coated on the semiconductor layer, and the semiconductor layer may be patterned by a photolithography process using a first photo-mask, and thus, the active layer 212 and the first electrode 312 may be formed. The first mask process using photolithography may involve a series of processes, such as exposing the first photo-mask by using exposure equipment, developing, etching, and stripping or ashing.

The semiconductor layer may include amorphous silicon or crystalline silicon (polysilicon). The crystalline silicon may be formed by crystallizing amorphous silicon. The amorphous silicon may be crystallized using, for example, a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, or any combination thereof. The semiconductor layer may include, for example, amorphous silicon or crystalline silicon. Any suitable material or combination of materials may be used in the semiconductor layer. For example, the semiconductor layer may include an oxide semiconductor and an organic semiconductor.

FIG. 7B schematically illustrates a cross-sectional view of a second mask process of the method of manufacturing the OLED apparatus. Referring to FIG. 7B, a first insulating layer 13 may be formed on a resultant structure of the first mask process of FIG. 7A, and a transparent conductive oxide layer may be formed on the first insulating layer 13. Thereafter, the first insulating layer may be patterned. As a result of the patterning, a first contact layer 114 and a second electrode 314 of a capacitor may be formed on the first insulating layer 13.

FIG. 7C schematically illustrates a cross-sectional view of a third mask process of the method of manufacturing the OLED apparatus. A first metal layer may be stacked on a resultant structure of the second mask process of FIG. 7B and may then be patterned. The first metal layer may include a single layer or layers that may include at least one metal selected from Al, Pt, Pd, Ag, Mg, Au, Ni, Nd, Ir, Cr, Li, Ca, Mo, Ti, W, and Cu. As a result of the patterning, a gate electrode 215 and a second contact layer 115 covering the first contact layer 114 may be formed on the first insulating layer 13. A resultant structure may be doped with ion impurities. The ion impurities may be B ion impurities or P ion impurities, and doping may be performed on the active layer 212 of the thin film transistor and the first electrode 312 of the capacitor as targets with a concentration of about $1 \times 10^{15}$ atoms/cm$^2$ or more.

The gate electrode 215 may be used as a self-aligned mask to dope the active layer 212 with ion impurities. The active layer 212 may include source and drain regions 212a and 212b doped with ion impurities and a channel region 212c therebetween. The first electrode 312 of the capacitor may be also doped with ion impurities, and thus, an electrode forming an MIM CAP may be implemented. The number of doping processes may be reduced by simultaneously doping the active layer 212 and the first electrode 312 of the capacitor through one doping process, thereby reducing the manufacturing cost.

Figure 7D:
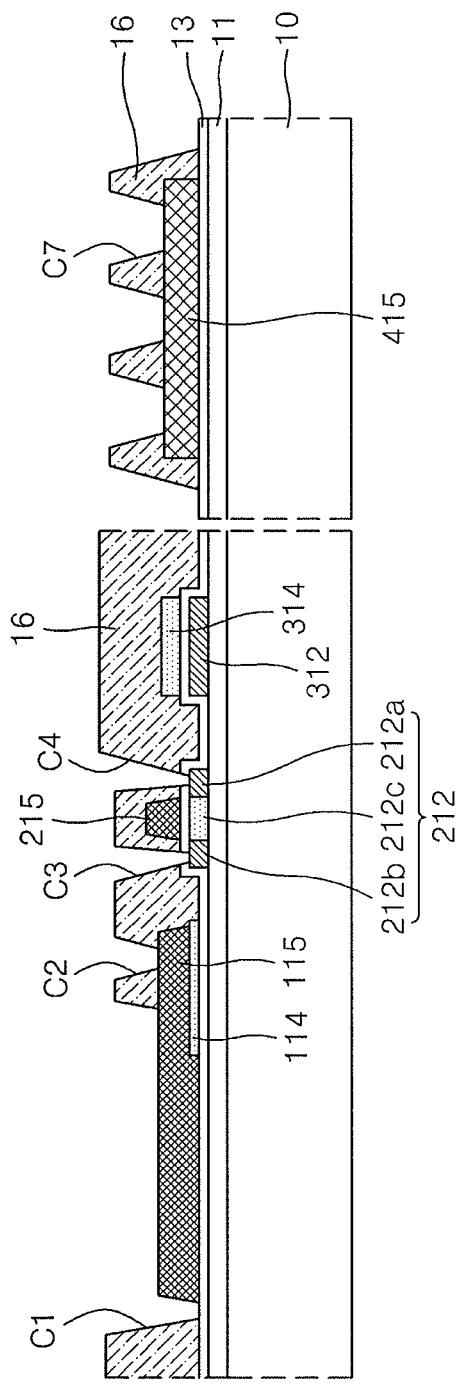

FIG. 7D schematically illustrates a cross-sectional view of a fourth mask process of the method of manufacturing the OLED apparatus. Referring to FIG. 7D, a second insulating layer 16 that is an interlayer insulating layer may be formed on a resultant structure of the third mask process of FIG. 7C, and the second insulating layer 16 may be patterned. Openings C3 and C4 respectively exposing a source region 212a and drain region 212b of the active layer 212 and a plurality of openings C7 exposing an upper surface of the pad electrode 415 may be formed. Convex portions A (see FIG. 6) may be formed between the plurality of openings C7 by patterning the second insulating layer 16 to have a concave-convex pattern.

Figure 7E:
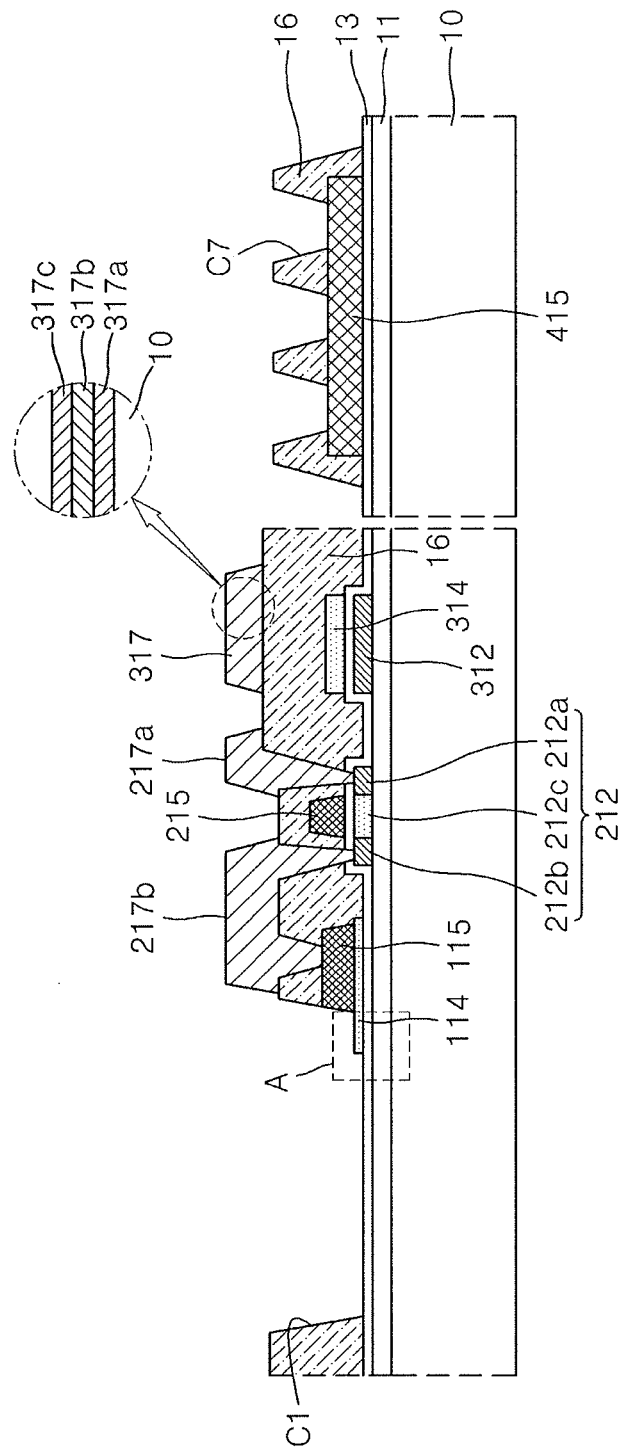

FIG. 7E schematically illustrates a cross-sectional view of a fifth mask process of the method of manufacturing the OLED apparatus. Referring to FIG. 7E, a second metal layer may be formed on a resultant structure of the fourth mask process of FIG. 7D, and the second metal layer may be patterned. The source and drain electrodes 217a and 217b and a third electrode 317 of the capacitor may be formed simultaneously. The second metal layer may include two or more metal layers that may include different types of metals having different electron mobilities. The second metal layer may include two or more metal layers selected from Al, Pt, Pd, Ag, Mg, Au, Ni, Nd, Ir, Cr, Li, Ca, Mo, Ti, W, Cu, and an alloy thereof.

A configuration of the third electrode 317 is described to present an example of a configuration of the second metal layer. For example, the second metal layer may include a first layer 317a including molybdenum (Mo), a second layer 317b including aluminum (Al), and a third layer 317c including molybdenum (Mo). The second layer 317b including aluminum (Al) may be a metal layer having a low resistance and excellent electrical characteristics, and the first layer 317a under the second layer 317b and including molybdenum (Mo) may improve adhesion between the second layer 317b and the second insulating layer 16. The third layer 317c over the second layer 317b including molybdenum (Mo) may serve as a barrier layer preventing the heel lock of aluminum included in the second layer 317b, oxidation and diffusion. In the fifth mask process, data wirings may also be formed by patterning the second metal layer.

Figure 7F:
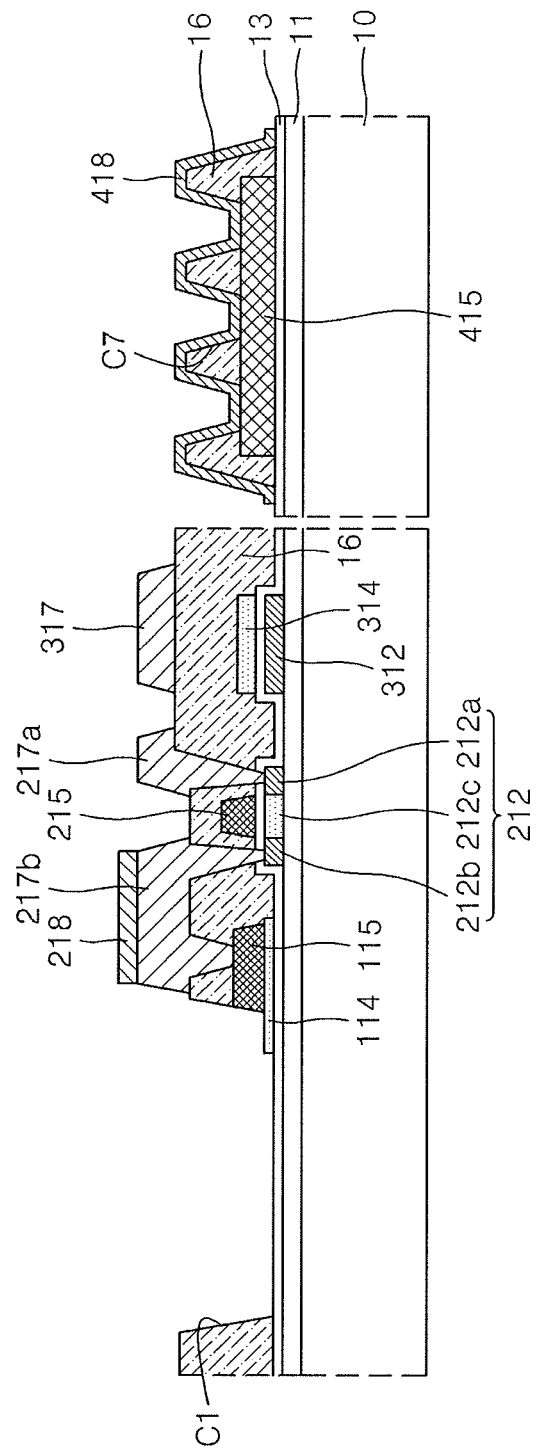

FIG. 7F illustrates a cross-sectional view of a sixth mask process of the method of manufacturing the OLED apparatus. Referring to FIG. 7F, a conductive contact layer 218 and a conductive barrier layer 418 may be simultaneously formed on a resultant structure of the fifth mask process of FIG. 7E. The conductive barrier layer 418 may be formed to be continuous on the plurality of openings C7 and the convex portions A formed from the second insulating layer 16 to prevent the pad electrode 415 from being exposed.

Figure 7G:
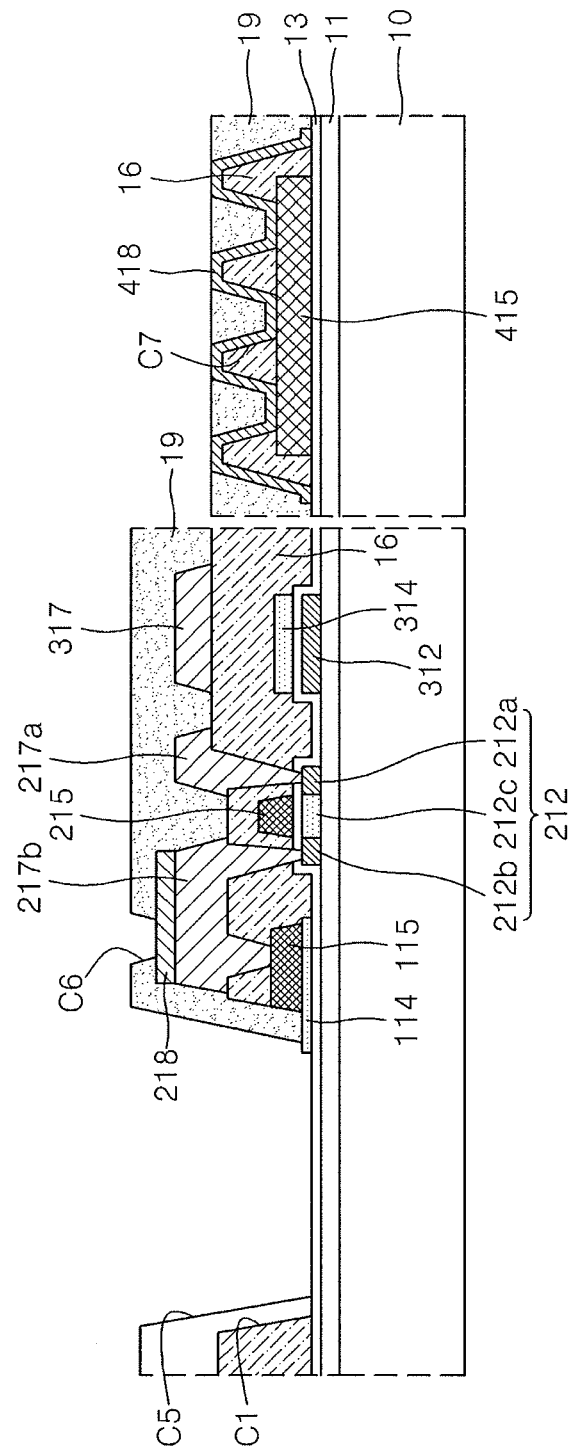

FIG. 7G illustrates a cross-sectional view of a seventh mask process of the method of manufacturing the OLED apparatus. Referring to FIG. 7G, a third insulating layer 19 that is a planarization insulating layer may be formed on a resultant structure of the sixth mask process of FIG. 7F, and the third insulating layer 19 may be patterned. A contact hole C6 exposing an upper portion of the conductive contact layer 218 may be formed and an opening C5 may be in a pixel area PXL1 in which a pixel electrode 120 is located.

The third insulating layer 19 may cover an edge of the conductive barrier layer 418 and may fill the openings C7 formed in the second insulating layer 16. An upper portion of the third insulating layer 19 that may be substantially planar with an upper portion of the conductive barrier layer 418 on the convex portions A may include the second insulating layer 16. The third insulating layer 19 may partially or completely enclose the source electrode 217a and the drain electrode 217b to prevent a different type of wiring having a different potential difference from being in contact with etchant containing dissolved Ag ions at the time of etching the pixel electrode 120 including silver (Ag).

The opening C5 formed in the third insulating layer 19 and the opening C1 formed in the second insulating layer 16 may overlap each other. The opening C5 formed in the third insulating layer 19 may be smaller than the opening C1 formed in the second insulating layer 16. The height of the third insulating layer 19 formed in the pad area in the seventh mask process may be formed to be lower than the height of the third insulating layer 19 formed in the display area DA by using a half-tone mask.

Figure 7H:
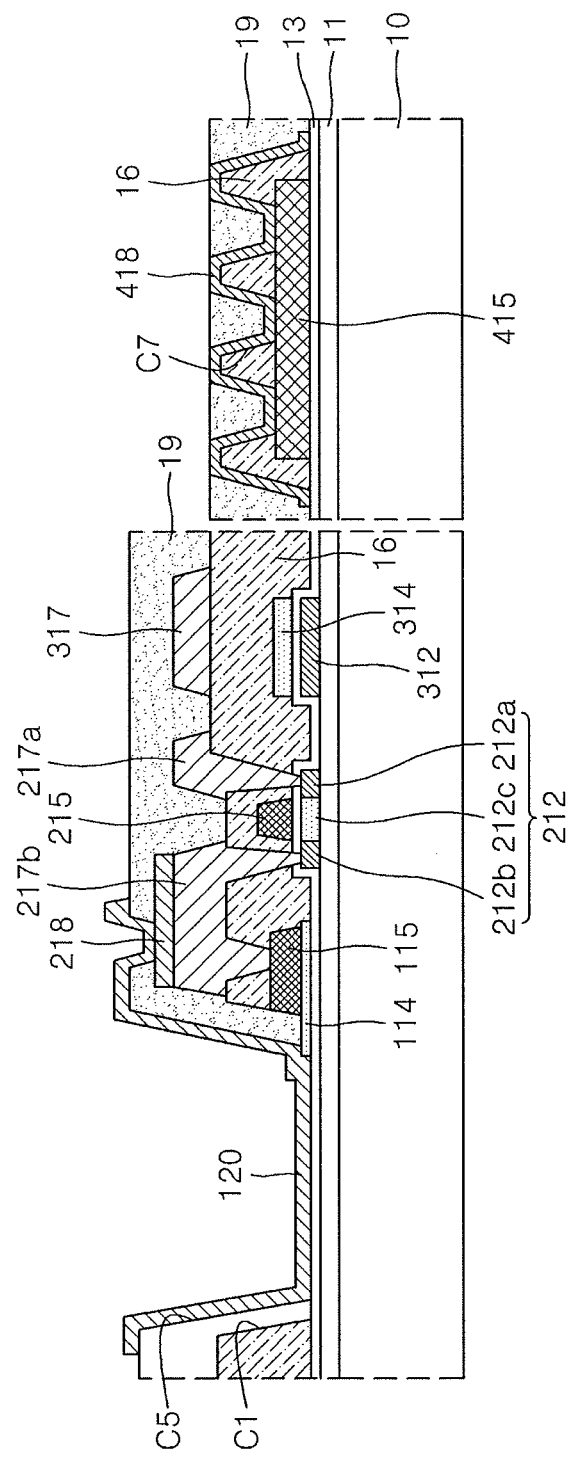

FIG. 7H schematically illustrates a cross-sectional view of an eighth mask process of the method of manufacturing the OLED apparatus. Referring to FIG. 7H, a pixel electrode 120 may be formed by forming a semi-transparent metal layer on a resultant structure of the seventh mask process of FIG. 7G, and patterning the semi-transparent metal layer.

The pixel electrode 120 may be in the opening C5 in the third insulating layer 19 and may be connected to a driving transistor via the opening C6 (see FIG. 7). The pixel electrode 120 may include the semi-transparent metal layer 120b (see FIG. 6). The pixel electrode 120 may further include first and second transparent oxide layers 120a and 120c (see FIG. 6) over and under the semi-transparent metal layer 120b (see FIG. 6) to protect the semi-transparent metal layer 120b (see FIG. 6).

The semi-transparent metal layer 120b (see FIG. 6) may include silver (Ag) or silver alloy. The first and second transparent conductive oxide layers 120a and 120c may each include at least one selected from the group including indium tin oxide, indium zinc oxide, zinc oxide, indium oxide, indium gallium oxide, and aluminum zinc oxide. The semi-transparent metal layer 120b and the opposite electrode 122 that is a reflective electrode may form a micro-cavity structure together, thereby improving an optical efficiency of the OLED apparatus.

When a metal having a high reducibility, such as silver (Ag), is used, when electrons are provided, Ag ions present in a ionic state in the etchant may be re-precipitated as silver (Ag) during an etching process for patterning of the pixel electrode 120. In the process of etching the pixel electrode 120 including silver (Ag), data wirings may include the same material as the source electrode 217a and the drain electrode 217b, or the source electrode 217a and drain electrode 217b may be exposed to etchant, and thus, silver (Ag) ions having a high reducibility may be provided with electrons from its metal material and be re-precipitated as silver.

The source electrode 217a and the drain electrode 217b may be patterned in advance and covered by the third insulating layer 19, which may be an organic film before the eighth mask process of patterning the pixel electrode 120. Accordingly, the source electrode 217a or the drain electrode 217b might not be exposed to etchant including silver (Ag) ions during etching of the pixel electrode 120 including silver (Ag). A particle-type defect due to re-precipitation of Ag may be prevented. The drain electrode 217b is exposed by the contact hole C6 in the third insulating layer 19. The conductive contact layer 218 may be on the drain electrode 217b. Accordingly, the drain electrode 217b might not be exposed to etchant during the etching of the pixel electrode 120. A particle-type defect due to re-precipitation of Ag may be prevented.

Figure 7I:
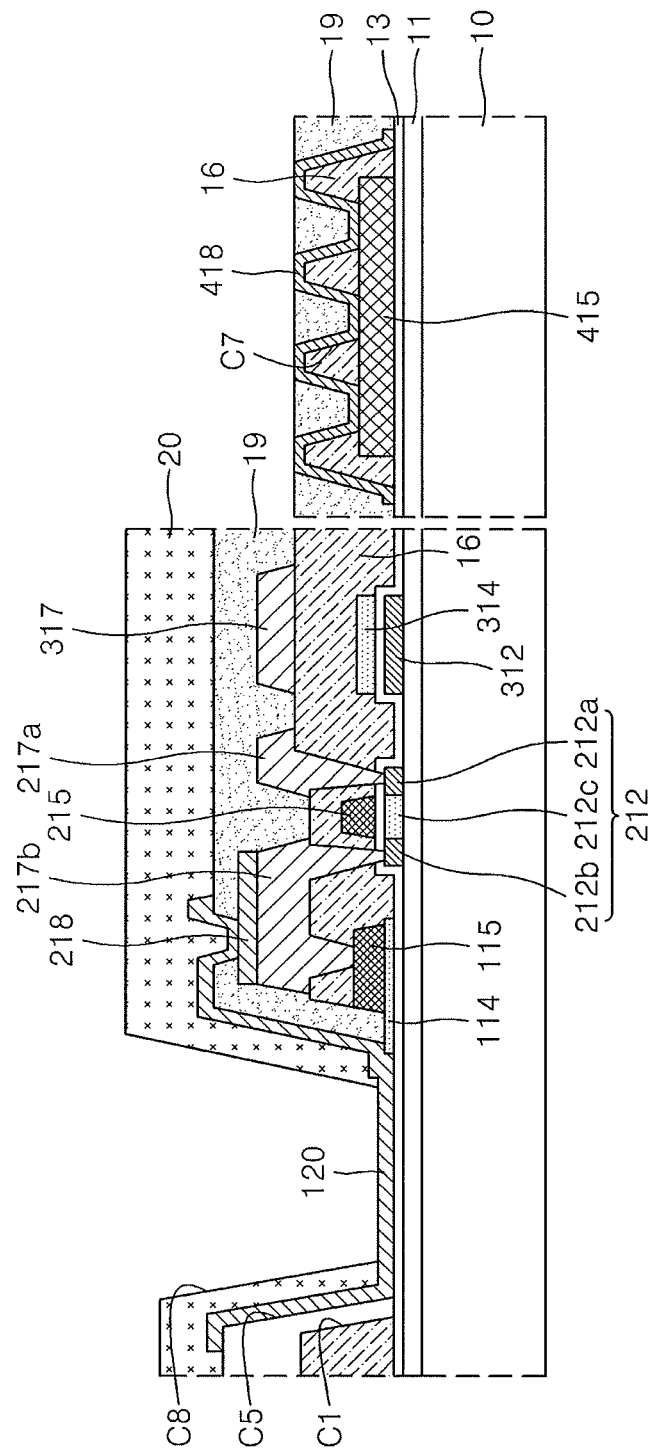

FIG. 7I illustrates a cross-sectional view of a ninth mask process of the method of manufacturing the OLED apparatus. Referring to FIG. 7I, after a fourth insulating layer 20 is formed on a resultant structure of the eighth mask process of FIG. 7H, the ninth mask process of forming an opening C8 exposing an upper portion of the pixel electrode 120 is performed.

The fourth insulating layer 20 may serve as a pixel-defining layer, and may include an organic insulating film including, for example, a general-purpose polymer (PMMA, PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. An intermediate layer including an organic emission layer 121 (see FIG. 6) may be formed on a resultant structure of the ninth mask process of FIG. 7I, and an opposite electrode 122 (see FIG. 6) may be formed.

The pixel electrode 120 may include the semi-transparent metal layer 120b, and the opposite electrode 122 may be formed by a transparent metal layer, thereby forming a micro-cavity and thus improving an optical efficiency of the OLED apparatus. The source electrode 217a and the drain electrode 217b may be covered by the third insulating layer 19 that may be an organic film to prevent exposure of the source electrode 217a or the drain electrode 217b to etchant including silver (Ag) ions, thereby preventing a particle-type defect due to re-precipitation of silver (Ag). The conductive contact layer 218 that is a protection layer may be formed on the upper portion of the drain electrode 217b, thereby preventing the drain electrode 217b from being exposed to etchant during etching of the pixel electrode 120 and thus preventing a particle-type defect due to re-precipitation of silver (Ag). The pad electrode 415 may be protected by patterning the second insulating layer 16 in a concave-convex shape and filling between the convex portions A with the third insulating layer 19. A crack occurring in the conductive barrier layer 418 may be prevented from propagating to the pad electrode 415, thereby preventing corrosion of the pad electrode 415 and other wirings electrically connectable to the pad electrode 415. The conductive barrier layer 418 may include the same material and be formed in the same process as the conductive contact layer 218, thereby simplifying a manufacturing process.

By way of summation and review, there is provided herein a pad electrode structure having excellent reliability and an OLED apparatus including the pad electrode structure.

Example embodiments have been disclosed herein, and although specific terms may be employed, they may be used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A pad electrode structure, comprising:
   a pad electrode;
   an interlayer insulating layer on the pad electrode and including a plurality of openings that expose an upper surface of the pad electrode;
   a conductive barrier layer on the plurality of openings and the interlayer insulating layer; and
   a planarization insulating layer covering an edge of the conductive barrier layer, the planarization insulating layer being in the openings,
   wherein the planarization insulating layer exposes a connector portion of the conductive barrier layer, the interlayer insulating layer being between the pad electrode and the exposed connector portion of the conductive barrier layer in a direction orthogonal to a plane of the pad electrode, and an upper surface of the planarization insulating layer is substantially coplanar with the connector portion of the conductive barrier layer.

2. The pad electrode structure as claimed in claim 1, wherein
   the interlayer insulating layer includes convex portions between the plurality of openings.

3. The pad electrode structure as claimed in claim 1, wherein the planarization insulating layer includes an organic insulating material.

4. The pad electrode structure as claimed in claim 1, wherein the interlayer insulating layer includes an inorganic insulating material.

5. The pad electrode structure as claimed in claim 1, wherein the conductive barrier layer includes indium tin oxide, indium zinc oxide, zinc oxide, indium oxide, indium gallium oxide, or aluminum zinc oxide.

6. An organic light-emitting display apparatus, comprising:
   a plurality of pixels including
      at least one thin film transistor including an active layer, a gate electrode, a source electrode, and a drain electrode,
      a conductive contact layer on the source electrode or the drain electrode,
      a pixel electrode that is connected to the source electrode or the drain electrode via the conductive contact layer,
      an opposite electrode opposite to the pixel electrode, and
      an intermediate layer including an organic emission layer between the pixel electrode and the opposite electrode; and
   a pad electrode structure that is electrically connected to the plurality of pixels, the pad electrode structure including
      a pad electrode electrically connected to the pixels,
      an interlayer insulating layer on the pad electrode and including a plurality of openings that expose an upper surface of the pad electrode,
      a conductive barrier layer including a same material as the conductive contact layer and the conductive barrier layer being on the plurality of openings and the interlayer insulating layer, and
      a planarization insulating layer covering an edge of the conductive barrier layer, the planarization insulating layer being in the openings,
   wherein the planarization insulating layer exposes a connector portion of the conductive barrier layer, the interlayer insulating layer being between the pad electrode and the exposed connector portion of the conductive barrier layer in a direction orthogonal to a plane of the pad electrode and an upper surface of the planarization insulating layer is substantially coplanar with the connector portion of the conductive barrier layer.

7. The organic light-emitting display apparatus as claimed in claim 6, wherein the pad electrode includes a same material as the gate electrode and is in a same layer as the gate electrode.

8. The organic light-emitting display apparatus as claimed in claim 6, wherein the interlayer insulating layer includes a same material as an insulating layer between the gate electrode and the source and drain electrodes.

9. The organic light-emitting display apparatus as claimed in claim 6, wherein the planarization insulating layer includes a same material as an insulating layer covering the source electrode and the drain electrode.

10. The organic light-emitting display apparatus as claimed in claim 6, wherein the interlayer insulating layer includes convex portions between the plurality of openings.

11. The organic light-emitting display apparatus as claimed in claim 6, wherein the planarization insulating layer includes an organic insulating material.

12. The organic light-emitting display apparatus as claimed in claim 6, wherein the interlayer insulating layer includes an inorganic insulating material.

13. The organic light-emitting display apparatus as claimed in claim 6, wherein the conductive contact layer and the conductive barrier layer include indium tin oxide, indium zinc oxide, zinc oxide, indium oxide, indium gallium oxide, or aluminum zinc oxide.

14. The organic light-emitting display apparatus as claimed in claim 6, wherein the pixel electrode includes a semi-transparent metal layer.

15. The organic light-emitting display apparatus as claimed in claim 14, wherein the semi-transparent metal layer includes silver (Ag) or silver alloy.

16. The organic light-emitting display apparatus as claimed in claim 6, further comprising:
   a first insulating layer between the active layer and the gate electrode;

a second insulating layer between the gate electrode and the source and drain electrodes;

a third insulating layer covering an edge of the pixel electrode, and the second insulating layer, the third insulating layer, and a fourth insulating layer including openings that overlap each other.

17. The organic light-emitting display apparatus as claimed in claim 16, wherein the opening in the third insulating layer is larger than the opening in the fourth insulating layer and smaller than the opening in the second insulating layer.

18. The organic light-emitting display apparatus as claimed in claim 6, further comprising a capacitor including:

a first electrode in a same layer as the active layer and including a semiconductor material doped with ion impurities; and a second electrode in a same layer as the gate electrode and including a transparent conductive oxide material.

19. The pad electrode structure as claimed in claim 1, wherein the connector portion of the conductive barrier layer is connectable to a connector of a circuit board.

20. The organic light-emitting display apparatus as claimed in claim 6, further comprising a circuit board, wherein the circuit board includes a connector in contact with the connector portion of the pad electrode structure.

* * * * *